United States Patent [19]
Kadota et al.

[11] Patent Number: 5,260,913
[45] Date of Patent: Nov. 9, 1993

[54] SURFACE WAVE DEVICE

[75] Inventors: Michio Kadota; Kazuhiko Morozumi, both of Nagaokakyo, Japan

[73] Assignee: Murata Manufacturing Co., Ltd., Japan

[21] Appl. No.: 819,174

[22] Filed: Jan. 10, 1992

[30] Foreign Application Priority Data

Jan. 11, 1991 [JP] Japan ................... 3-002034
Jan. 11, 1991 [JP] Japan ................... 3-002036
Oct. 30, 1991 [JP] Japan ................... 3-284903

[51] Int. Cl.[5] .............. H04R 17/00; H01L 41/04; H01L 41/08; H01L 41/18
[52] U.S. Cl. .................. 367/140; 310/313 R; 310/313 B; 333/154; 333/193; 333/194
[58] Field of Search ............... 367/140, 164; 310/313 R, 313 B, 313 C, 313 D; 333/193, 194, 195, 150, 151, 154

[56] References Cited

U.S. PATENT DOCUMENTS 4,947,677 8/1990 Frye et al. ................... 73/38

FOREIGN PATENT DOCUMENTS 2016849 9/1979 United Kingdom .

Primary Examiner—J. Woodrow Eldred
Attorney, Agent, or Firm—Ostrolenk, Faber, Gerb & Soffen

[57] ABSTRACT

A surface acoustic wave device which is a surface acoustic wave resonator utilizing an SH-type surface wave, wherein a resin layer made of a resin material in the form of gel or having a Shore hardness of not more than 30 is formed so as to coat at least an interdigital transducer formed on the upper surface of a piezoelectric substrate.

14 Claims, 12 Drawing Sheets

SURFACE WAVE DEVICE

BACKGROUND OF THE INVENTION

1. Field of the Invention

The present invention relates to a surface acoustic wave (SAW) device utilizing SH-type SAWs, whose main displacement is in the direction perpendicular to the direction of the SAW propagation, such as a BGS wave (Bleustein-Gulyaev-Shimizu Wave).

2. Description of the Prior Art

In a SAW device, the adhesion of an elastic material on a SAW propagation path and an interdigital transducer (IDT) has been conventionally put under taboo. The reason for this is that a SAW is absorbed by the elastic material so that an output of the SAW is damped. Consequently, in constructing the SAW as a component, a cavity for not preventing the propagation of the SAW has been provided on the SAW propagation path and the IDT. As a result, a package structure of the SAW device has been complicated and high in cost.

On the other hand, Japanese Patent Laid-Open Gazette No. 108551/1979 discloses a structure in which the above described cavity is omitted in a SAW filter utilizing a BGS wave. More specifically, the prior art discloses a structure in which insulating rubber in the form of a viscous material at room temperature and in an atmosphere and cured by the heating or moisture absorbing is arranged on an IDT and a SAW propagation path, thereby to omit the cavity. It is described that an output of the BGS SAW filter is not damped even if the above described insulating rubber is arranged on the IDT and the SAW propagation path. As the above described insulating rubber in the form of a viscous material at room temperature and in an atmosphere and cured by the heating or moisture absorbing, only silicone rubber cured by moisture absorption is specifically shown.

However, the SAW resonator utilizing a BGS wave has the disadvantage in that if the IDT and the SAW propagation path are coated with the silicone rubber, the impedance at a resonant frequency and the propagation loss are significantly increased, so that the resonance characteristics and filter characteristics are degenerated.

SUMMARY OF THE INVENTION

Accordingly, an object of the present invention is to provide a SAW device utilizing SH-type SAWs such as a BGS wave and so on, which has a structure in which an IDT is coated with an elastic material so that its package structure can be simplified and the resonance characteristics are not easily varied.

In view of the fact that the impedance at a resonant frequency is degenerated even if insulating silicone rubber is merely provided on the IDT and the SAW propagation path in the device utilizing a BGS wave, the inventors of the present application have examined the change in the resonance characteristics by coating, for example, an IDT and/or a SAW propagation path with various types of resin in various SAW devices utilizing a BGS wave.

As a result, the inventors have found that also in a SAW device utilizing not only the BGS wave but also SH-type SAWs whose main displacement is in the direction perpendicular to the direction of the SAW propagation, for example, a Love wave, an output of the SAW is not damped when the IDT is coated with a particular resin layer. In addition, as a result of examining the resonance characteristics using various types of resin, the inventors have found that an output of the SAW is not damped even if not only silicone resin but also urethane resin and epoxy resin are used. Further, they have found that resin in the form of gel or having a Shore hardness of not more than 30 must be used so as to restrain the variation in the resonance characteristics, to make the present invention.

More specifically, the present invention provides a SAW device utilizing an SH-type SAW whose main displacement is in the direction perpendicular to the direction of the SAW propagation on a piezoelectric substrate, which is characterized by comprising a piezoelectric substrate, at least one IDT formed on the piezoelectric substrate, and a resin layer in the form of gel or having a Shore hardness of not more than 30 which is provided so as to coat at least the above IDT.

Examples of the resin which can be used in the present invention include silicone resin, urethane resin or epoxy resin and so on. In addition, one "in the form of gel" refers to one in such a flexible state as to be unmeasurable by the Shore hardness measuring method and specifically, one whose rate of penetration measured by the penetrometer based on JIS K2220 which is the Japanese Industrial Standard or ASTM D1403 corresponding to it is in the range of approximately 200 to 20. On the other hand, the Shore hardness refers to a hardness measured by ASTM D676 or JIS K6301 corresponding to it.

Meanwhile, the above described values of the hardness and the rate of penetration are ones measured after the resin used is cured at temperatures of 70° to 150° C. for one to two hours.

In the present invention, the reason why the above described resin in the form of gel or having a Shore hardness of not more than 30 must be used is as follows: When the IDT is coated with a resin layer having a Shore hardness of more than 30, the impedance at a resonant frequency is significantly increased, thereby to make it impossible to ignore the change in the resonance characteristics.

Furthermore, the above described resin layer may be provided so as to cover at least the IDT, or may be formed on the entire surface on which the IDT is formed of the piezoelectric substrate. However, it is not preferable that the SAW propagation path is coated with the above resin layer because an output of the SAW is slightly damped. More preferably, the above resin layer is provided not only on the surface on which the IDT is formed of the piezoelectric substrate but also so as to lead to the side surfaces of the piezoelectric substrate. The reflection of a bulk wave or the like from the side surfaces of the piezoelectric substrate can be restrained by thus coating the side surfaces of the piezoelectric substrate with the resin layer, thereby to make it possible to reduce spurious modes.

In the present invention, at least the IDT is coated with the resin layer in the form of gel or having a Shore hardness of not more than 30, thereby to make it possible to omit a cavity which is a factor complicating the structure of the SAW device in the case of the commercialization. In addition, the IDT is coated with the above described particular resin layer, so that the output of the SAW is not easily damped and the resonance characteristics are not easily changed.

Additionally, in accordance with a preferred particular aspect of the present invention, insulating powder is dispersed in the above described resin layer in the form of gel or having a Shore hardness of not more than 30. The insulating powder is dispersed so as to lower the fluidity of the resin in the form of gel or having a Shore hardness of not more than 30. That is, the fluidity of the resin layer in the form of gel or having a Shore hardness of not more than 30 is restrained because the insulating powder is dispersed in the resin layer. Consequently, the resin layer can be prevented from adhering to an undesired portion of the resin layer in the case of packaging, thereby to make it possible to obtain a reliable package structure.

Insulating powder made of a suitable material and having a suitable particle diameter can be used as the above described insulating powder, provided that it allows the fluidity of the resin in the form of gel or having a Shore hardness of not more than 30 to be lowered. Examples of the insulating powder include fine powdered silica, niobic oxide powder and abrasive powder. Insulating powder having a particle diameter of approximately 0.1 to 10 $\mu$m is generally used.

Furthermore, in accordance with another particular aspect of the present invention, steps projected outward are formed in a position at an almost medium height of end surfaces of the above described piezoelectric substrate which exist in the direction of the SAW propagation, end surface portions below the steps are formed as rougher surfaces than end surface portions above the steps, and the above described resin layer in the form of gel or having a Shore hardness of not more than 30 is formed so as to cover the upper surface of the above piezoelectric substrate and the end surface portions above the steps. The reason why the steps are formed on the end surfaces of the piezoelectric substrate and the end surface portions below the steps are formed as rough surfaces as described above is as follows:

Energy of an SH-type SAW is concentrated on a layer close to the surface of the piezoelectric substrate. On the other hand, energy of a bulk wave is distributed over the entire area in the thickness of the piezoelectric substrate. The above bulk wave is scattered by forming the end surface portions below the steps as rough surfaces as described above, thereby to make it possible to reduce a spurious mode due to the reflection of the bulk wave from the end surfaces. Moreover, the above resin layer in the form of gel or having a Shore hardness of not more than 30 is provided on the end surfaces of the piezoelectric substrate so as to cover the end surface portions above the steps. Accordingly, the reflection of the bulk wave from the end surface portions above the steps is also restrained, thereby to reduce a spurious mode more effectively.

Although the present invention has been described and illustrated in detail, it is clearly understood that the same is by way of illustration and example only and is not to be taken by way of limitation, the spirit and scope of the present invention being limited only by the terms of the appended claims.

DESCRIPTION OF THE PREFERRED EMBODIMENTS

Figure 2:
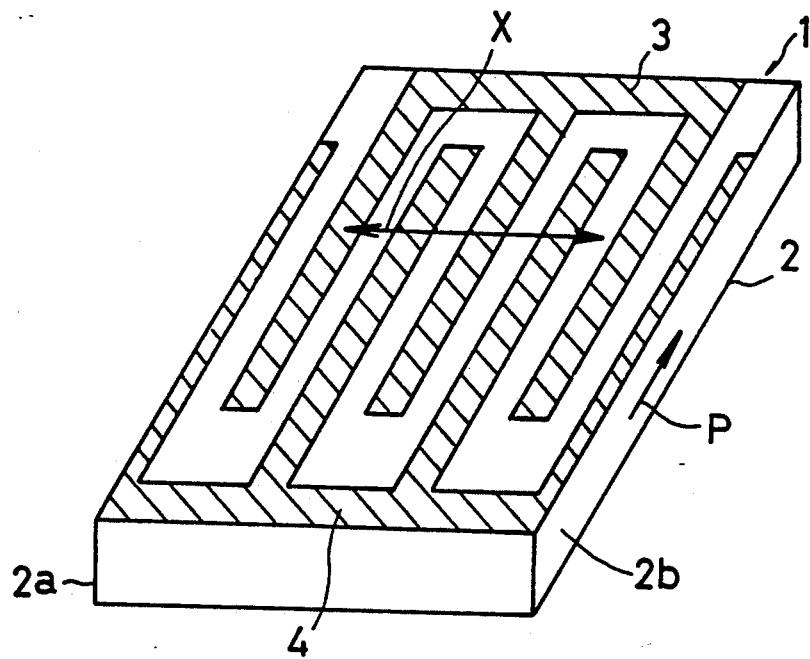
FIG. 2 is a perspective view showing a SAW resonator element used in the first embodiment.

FIG. 2 shows a SAW resonator element used in one embodiment of the present invention. The SAW resonator element 1 is constructed using a piezoelectric substrate 2 subjected to polarization processing in the direction of an arrow P. A pair of comb electrodes 3 and 4 is formed on the upper surface of the piezoelectric substrate 2. The comb electrodes 3 and 4 respectively have a plurality of electrode fingers inserted to each other. An AC electric field is applied between the comb electrodes 3 and 4, to induce a BGS wave in the direction of an arrow X. The BGS wave is reflected from end surfaces 2a and 2b.

Figure 1:
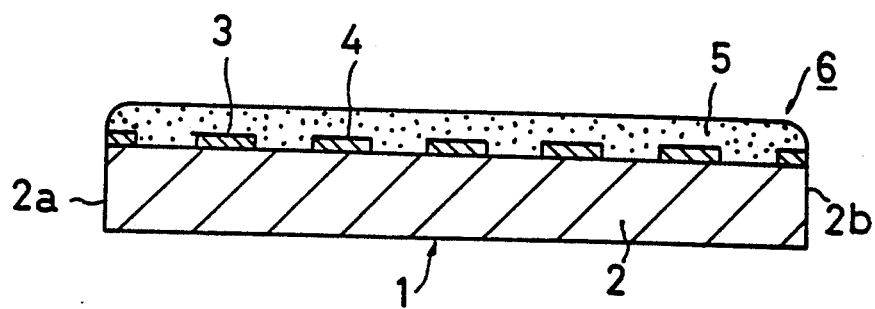
FIG. 1 is a cross sectional view showing a SAW resonator according to a first embodiment of the present invention.

In the present embodiment, a resin layer 5 is formed on the upper surface of the SAW resonator element 1 to construct a SAW resonator 6, as shown in a cross sectional view of FIG. 1. More specifically, the resin layer 5 is so provided as to coat an IDT constituted by the comb electrodes 3 and 4.

Silicone rubber in the form of gel having various rates of penetration (SE4440, SH1851, JCR6110 (trade name) manufactured by Toray Dowcoaning Silicone Co., Ltd.) and silicone rubber having various hardnesses (TSE3431H, TSE3251 (trade name) manufactured by Toshiba Silicone Co., Ltd.) are used as the resin layer 5, to construct the SAW resonator 6, and the impedance at a resonant frequency of the SAW resonator 6 is measured. The rate of penetration and the hardness of silicone rubber are measured through the following procedure.

(1) Penetrometer method . . . a measuring method based on JIS K2220 or ASTM D1403 corresponding to it, or a measuring method based on JIS K2207 (in this measuring method, the rate of penetration is so converted as to have the same value as that obtained by the measuring method based on JIS K2220).

(2) Shore hardness measuring method . . . a measuring method based on ASTM D676 or a measuring method based on JIS K6301 (the value obtained by the measuring method is approximately equivalent to the Shore hardness).

In addition, the rate of penetration or the Shore hardness of all of the above described silicone rubber in the form of gel having various rates of penetration and silicone rubber having various harnesses are measured after curing at temperatures of 70° to 150° C. for approximately one to two hours.

Figure 3:
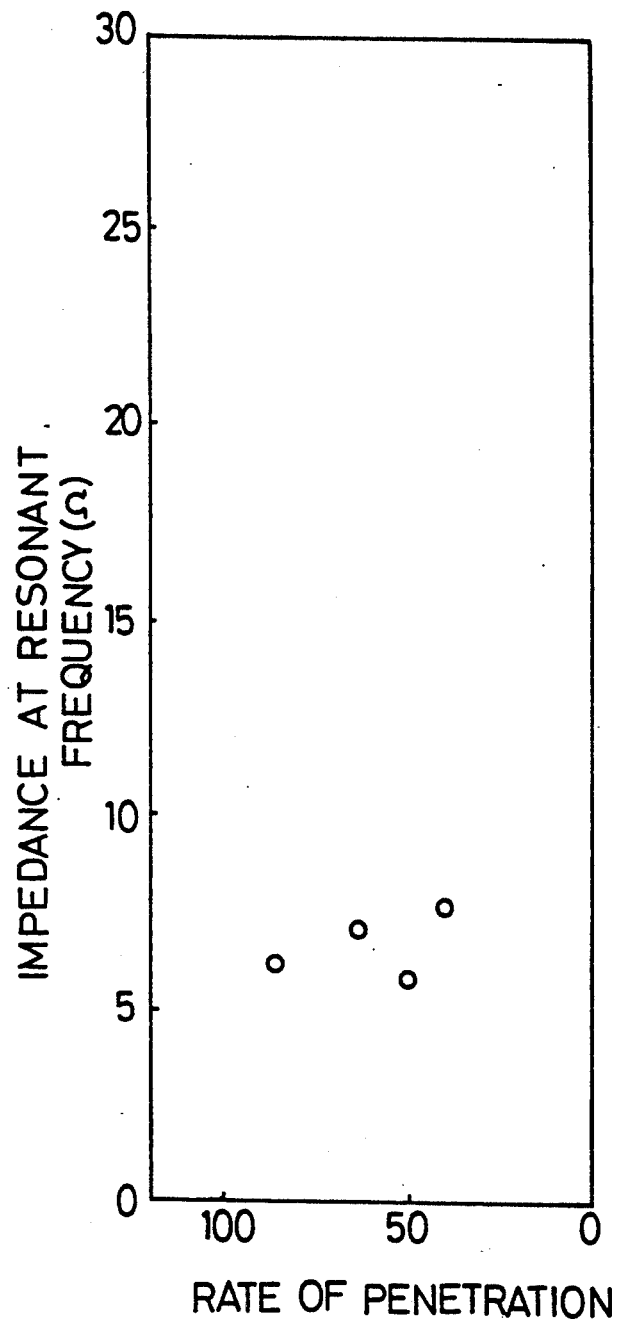
FIG. 3 is a diagram showing the impedance at a resonant frequency of a SAW resonator using a resin layer made of resin in the form of gel.
Figure 4:
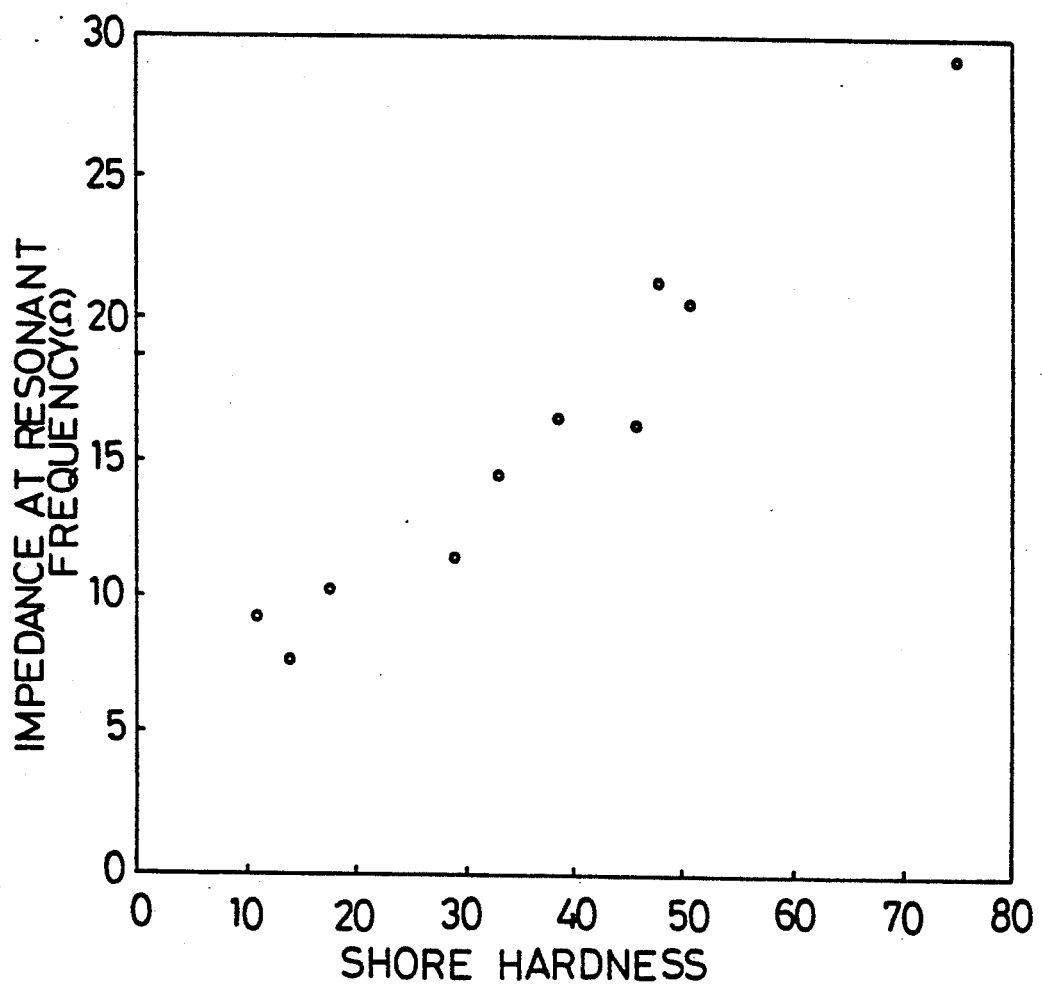
FIG. 4 is a diagram showing the impedance at a resonant frequency of a SAW resonator using silicone rubber.

The results are shown in FIGS. 3 and 4. The impedance at a resonant frequency of a SAW resonator provided with no resin layer is 5 Ω.

As can be seen from FIGS. 3 and 4, when silicone rubber in the form of gel having a rate of penetration in the range of 100 to 40 and silicone rubber having a Shore hardness of not more than 30 are used, the impedance at a resonant frequency of the SAW resonator is not more than 11 Ω, which is not so different from the impedance at a resonant frequency of the SAW resonator provided with no resin layer, i.e., 5 Ω. On the other hand, when silicone rubber having a Shore hardness of more than 30 is used, the impedance at a resonant frequency thereof is significantly increased.

Furthermore, although in the above described embodiment, the resin layer 5 is made of silicone rubber in the form of gel or silicone rubber such as two liquid type silicone foam, the resin layer 5 may be made of another resin such as urethane resin or epoxy resin.

Figure 5:
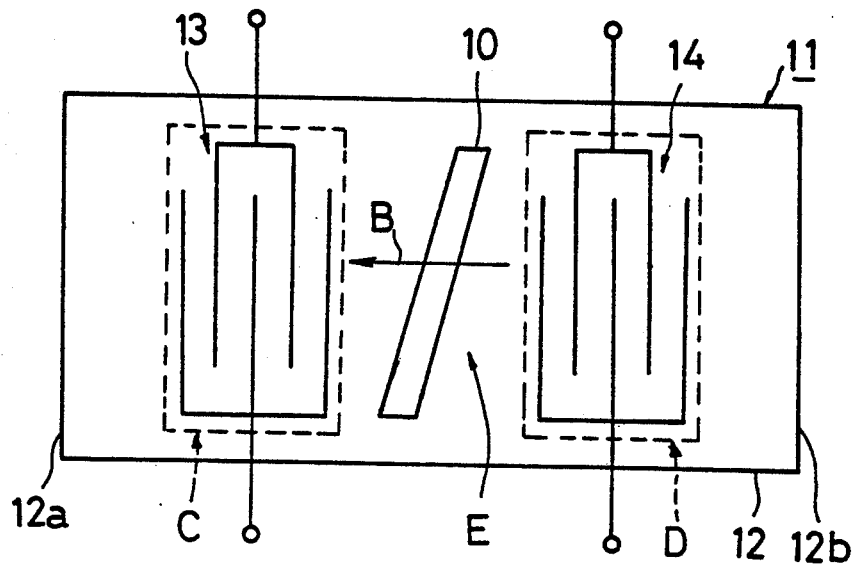
FIG. 5 is a schematic diagram showing another structure of a SAW device to which the present invention is applied.

FIG. 5 shows a SAW resonator according to another embodiment of the present invention. In a SAW device 11, two IDTs 13 and 14 are formed on a piezoelectric substrate 12, and a shielding electrode 10 is formed between the IDTs 13 and 14. More specifically, the SAW device 11 according to the present invention is constructed as a filter having two IDTs 13 and 14. An SH-type SAW induced by the IDT 13 or 14 is propagated in the direction indicated by an arrow B shown in FIG. 5.

Although in the SAW device 11 shown in FIG. 5, a resin layer is provided to the surfaces of the IDTs 13 and 14, that is, regions indicated by broken lines C and D, the resin layer may be formed on the entire upper surface of the piezoelectric substrate 12.

When the resin layer is formed on a SAW propagation path indicated by an arrow E, however, an output of the SAW is damped. Consequently, the resin layer is preferably formed in a region other than the SAW propagation path.

More preferably, the resin layer is provided so as to also lead to side surfaces 12a and 12b of the piezoelectric substrate 12. The reflection of a bulk wave from the side surfaces 12a and 12b can be restrained by thus forming the resin layer so as to lead to the side surfaces 12a and 12b, thereby to make it possible to reduce a spurious mode.

An example in which the SAW resonator shown in FIG. 1 is constructed as a product will be described with reference to the fabricating method.

Figure 6:
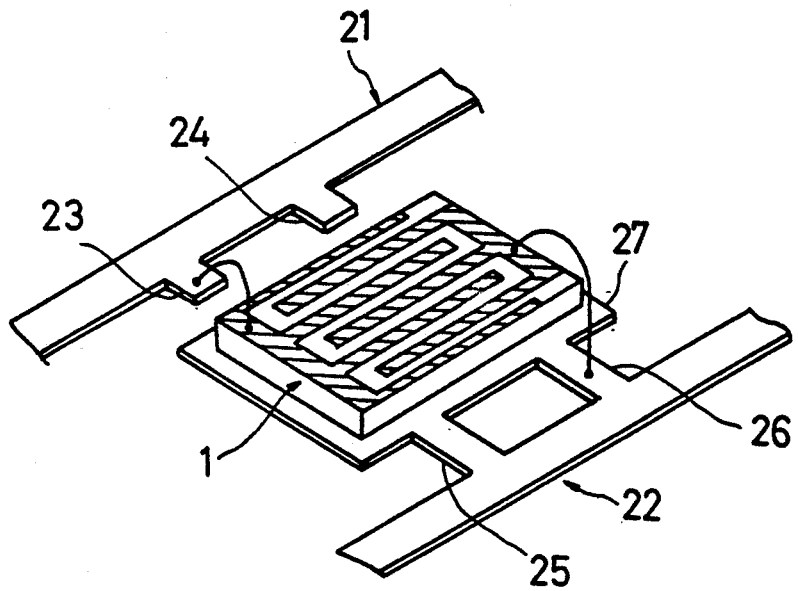
FIG. 6 is a perspective view showing a state where the SAW resonator element shown in FIG. 2 is fixed to a metal frame.

First, longitudinal metal frames 21 and 22 are prepared, as shown in a perspective view of FIG. 6. A plurality of terminal portions 23 and 24 are formed so as to extend toward the metal frame 22 from the metal frame 21. In addition, terminal portions 25 and 26 are formed so as to extend toward the metal frame 21 from the metal frame 22, and a rectangular device fixing portion 27 having a certain degree of area is provided in the top ends of the terminal portions 25 and 26. The SAW resonator element 1 shown in FIG. 2 is fixed to the upper surface of the device fixing portion 27 through adhesives.

Figure 7:
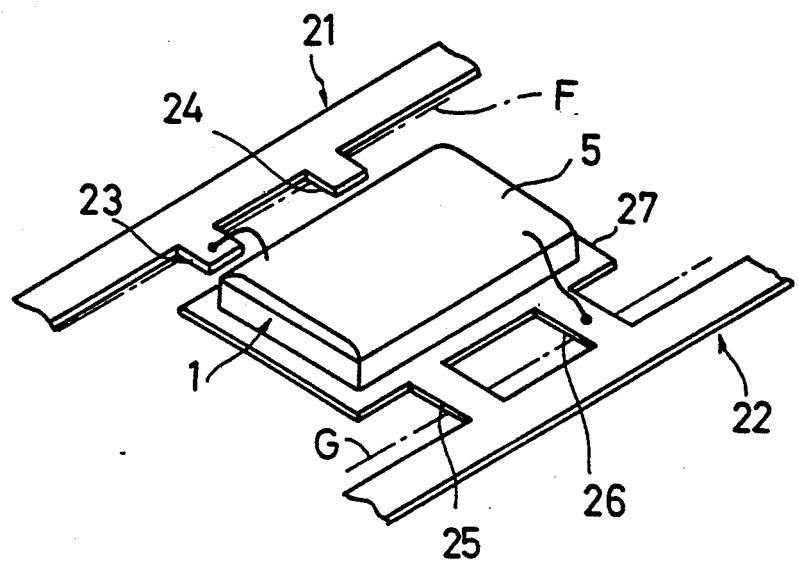
FIG. 7 is a perspective view showing a state where a resin layer is provided on the upper surface of the SAW resonator element.

Then, a resin layer 5 is applied to the upper surface of the SAW resonator element 1 and is cured, as shown in FIG. 7. The above described particular silicone rubber is used for the resin layer 5.

In the step in which the resin layer 5 is cured, the SAW resonator element 1, the device fixing portion 27, and the like are molded out of resin and then, are cut along one-dot and dash lines F and G shown in FIG. 7. In such a manner, it is possible to obtain a SAW resonator component 28 shown in a perspective view of FIG. 8. The reference numerals of the terminal portions provided for the above described metal frames 21 and 22 shall be used as reference numerals of terminals in the SAW resonator component 28 obtained.

Figure 8:
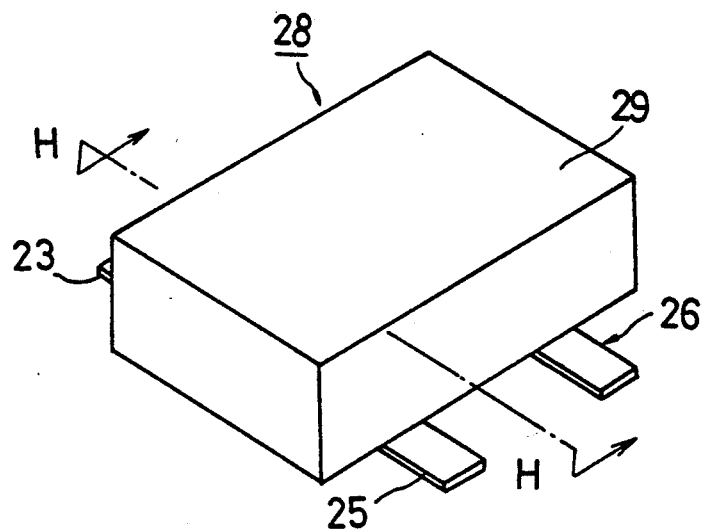
FIG. 8 is a perspective view showing a SAW resonator component in which a resin molded portion is formed.
Figure 9:
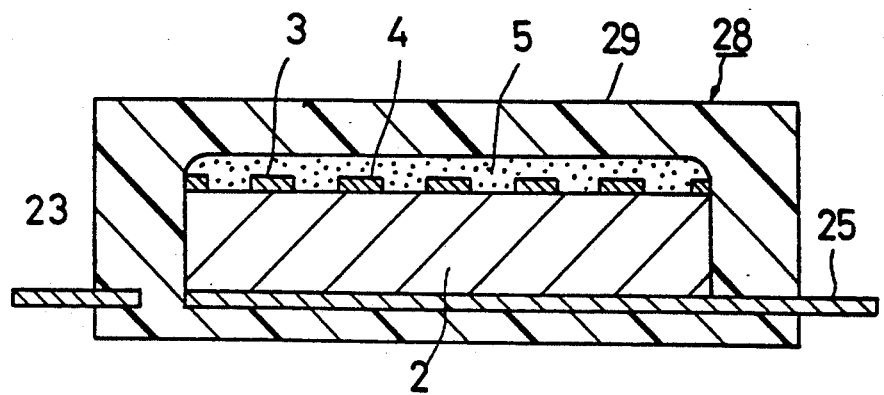
FIG. 9 is a cross sectional view showing the SAW resonator component shown in FIG. 8.

A cross section taken along a one-dot and dash line H-H in FIG. 8 is shown in FIG. 9. As can be seen from FIG. 9, in this SAW resonator component 28, the resin layer 5 is provided on the upper surface of the elastic SAW resonator element 1, and the outside of the resin layer 5 is coated with a resin molded portion 29. Consequently, there is no need to provide a cavity above the portion where the IDT is formed of the SAW resonator, thereby to make it possible to make the SAW resonator component 28 by the above described resin molding technique through relatively simple processes.

Meanwhile, the present invention can be applied to a product obtained by packaging using not only the above described structure in which the resin molded portion 29 is formed but also another structure such as a hermetic seal case.

When a resin layer in the form of gel or having a Shore hardness of not more than 30 is provided on a BGS wave propagation path as described above, the resonance characteristics are hardly degraded, thereby to make it possible to simplify the package structure. However, the above resin layer in the form of gel or having a Shore hardness of not more than 30 is significantly high in fluidity. Consequently, it may, in some cases, be difficult to reliably sheathe the SAW resonator with resin or package the SAW resonator using a metal case. This will be described with reference to FIGS. 10 and 11.

Figure 10:
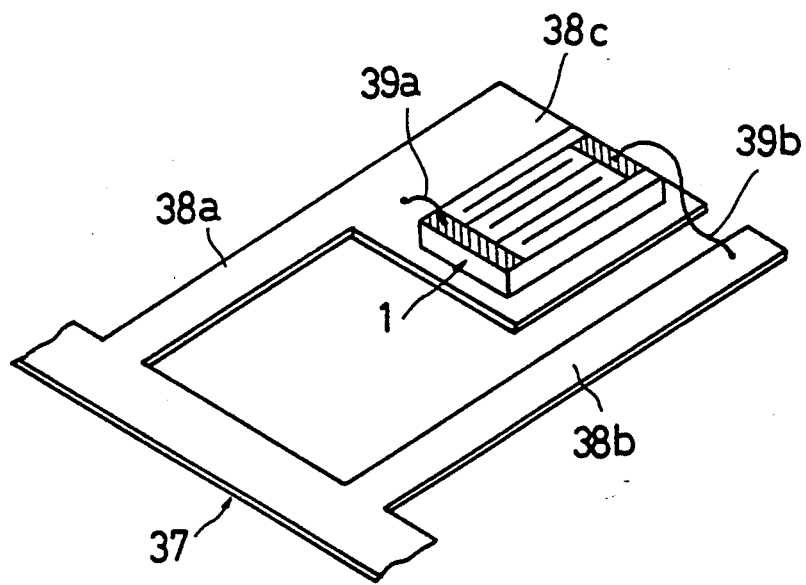
FIG. 10 is a partially cutaway view in perspective showing a state where a SAW resonator element is joined to terminals.

When the SAW resonator is constructed as a component sheathed with resin, lead terminals 38a and 38b formed integrally with a metal hoop 37 are prepared, as shown in FIG. 10. The SAW resonator element 1 shown in FIG. 2 is fixed to a device mounting portion 38c having a relatively large area in the top end of the lead terminal 38a, and the SAW resonator element 1 is electrically connected to the lead terminals 38a and 38b by bonding wires 39a and 39b.

Figure 11:
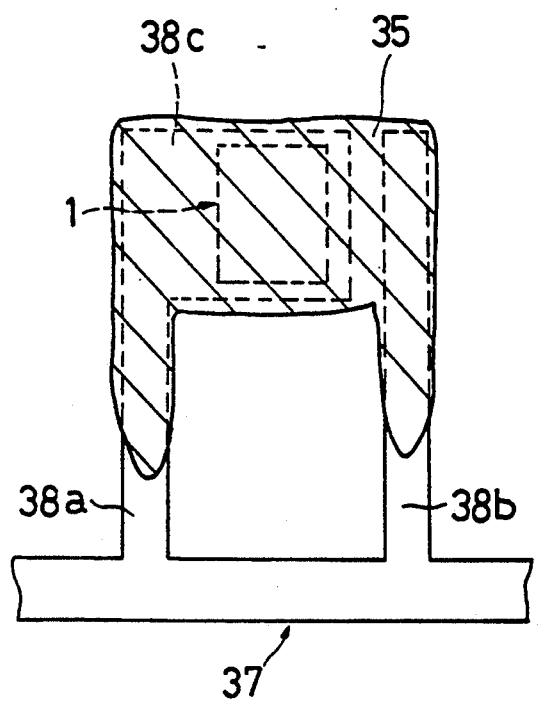
FIG. 11 is a partially broken plan view showing a state where resin in the form of gel or having a Shore hardness of not more than 30 is applied to the upper surface of the SAW resonator element shown in FIG. 10.

Then, the above described resin material in the form of gel or having a Shore hardness of not more than 30 is applied to the upper surface of the SAW resonator element 1, to form a resin layer 35. However, the above described resin material is very high in fluidity. Accordingly, as shown in FIG. 11, the resin material is liable to adhere to not only the SAW resonator element 1 and the device mounting portion 38c but also so as to lead to middle parts of the lead terminals 38a and 38b. As a result, even if the SAW resonator is sheathed with resin in the state shown in FIG. 11, the resin layer 35 is liable to exist between the sheathing resin and the lead terminals 38a and 38b. When the above described resin layer 35 is made of silicone rubber, a SAW device obtained absorbs moisture from the silicone rubber in the boundary between the lead terminals 38a and 38b and the sheathing resin because silicone rubber has high water absorption, so that there are possibilities of, for example, degrading the resonance characteristics and producing cutoff.

Furthermore, even when the SAW resonator element 1 shown in FIG. 2 is packaged using a metal case, resin constituting the above described resin layer in the form of gel or having a Shore hardness of not more than 30 may, in some cases, be introduced into a welding portion of a case material so that the case material is not sufficiently welded because the fluidity of the resin layer is high.

In the second embodiment of the present invention, insulating powder is dispersed in the above resin layer in the form of gel or having a Shore hardness of not more than 30, thereby to solve the above described various problems. Processes of obtaining a SAW device according to the second embodiment will be described with reference to FIGS. 12 to 14.

Figure 12:
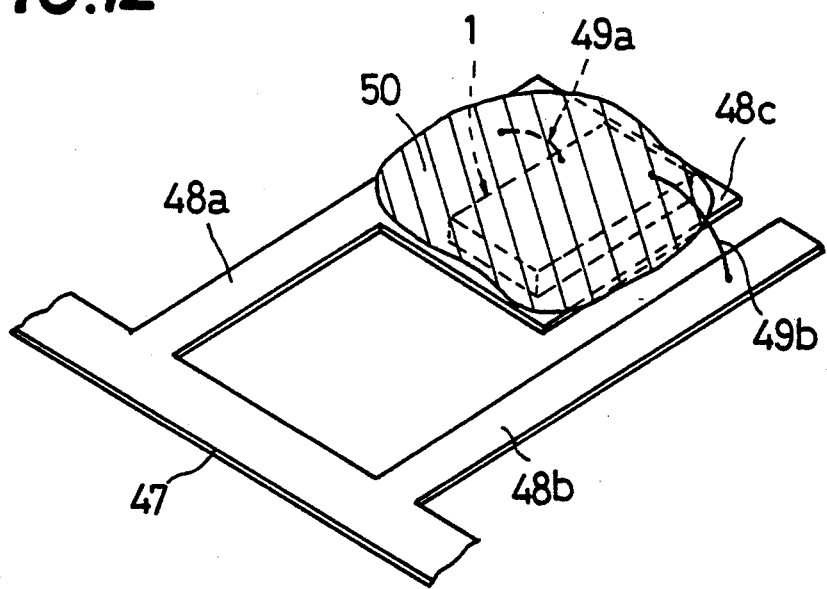
FIG. 12 is a partially cutaway view in perspective for explaining a state where a resin layer is formed on a SAW resonator element in a second embodiment of the present invention.

First, a metal hoop 47 is prepared, as shown in FIG. 12. Terminals 48a and 48b are integrated with the metal hoop 47, and a device mounting portion 48c having a large area is connected to the top end of the terminal 48a. The SAW resonator element 1 shown in FIG. 2 is fixed to the device mounting portion 48c using adhesives, as indicated by a broken line. The SAW resonator element 1 and the terminals 48a and 48b are joined to each other by bonding wires 49a and 49b. The bonding wires 49a and 49b are respectively joined to the above described comb electrodes 3 and 4 shown in FIG. 2.

A high polymeric resin material is then applied to the SAW resonator element 1, to form a resin layer 50, as shown in FIG. 12. The resin layer 50 is obtained by mixing insulating powder with resin in the form of gel or having a Shore hardness of not more than 30 and kneading them to uniformly disperse the insulating powder in the resin. One example of the resin in the form of gel is silicone resin such as TSJ3185 (trade name) manufactured by Toshiba Silicone Co., Ltd. On the other hand, one example of the resin having a Shore hardness of not more than 30 is silicone rubber such as TSE3251, 3155 (trade name) manufactured by Toshiba Silicone Co., Ltd. Used as the insulating powder is one made of niobic oxide powder having a particle diameter of approximately 1 $\mu$m to 5 $\mu$m. 50 Parts by weight of the above insulating powder is mixed with 100 parts by weight of the resin in the form of gel or having a Shore hardness of not more than 30.

In the above described manner, the resin layer 50 is constituted by the resin in the form of gel or having a Shore hardness of not more than 30 which has the insulating powder dispersed therein. Accordingly, the fluidity of the resin layer 50 is lowered, so that the resin layer 50 adheres to the outside of the SAW resonator element 1 without so spreading, as shown in FIG. 12.

Figure 13:
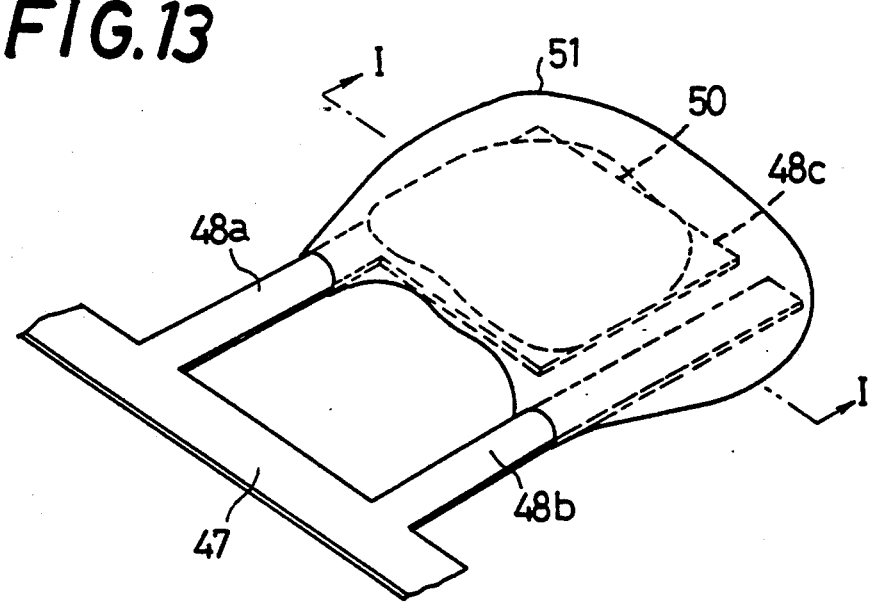
FIG. 13 is a partially cutaway view in perspective showing a state where the resin layer is formed and then, the resin layer is coated with resin in the second embodiment of the present invention.
Figure 14:
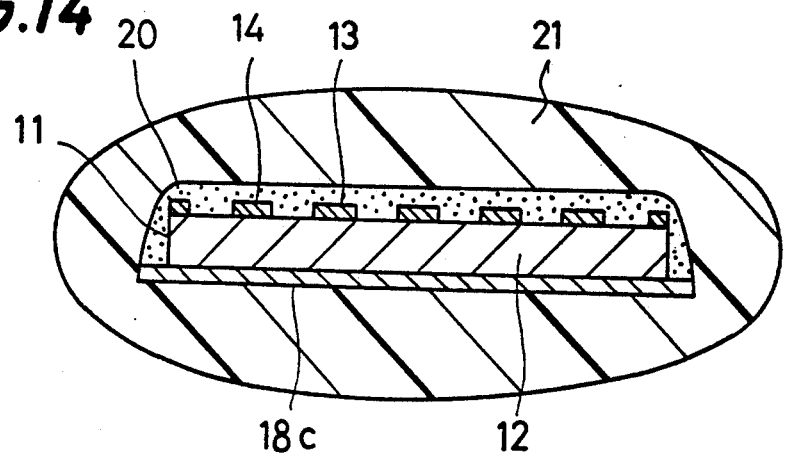
FIG. 14 is a cross sectional view showing a state where a SAW device according to the second embodiment of the present invention is sheathed with resin, which is taken along a line I—I shown in FIG. 13.

The resin layer 50 is then coated with sheathing resin 51 in the state shown in FIG. 12, except in parts on the side of the metal hoop 47 of the terminals 48a and 48b, as shown in FIG. 13. A suitable resin material which has been conventionally used as sheathing resin of an electronic component, for example, thermosetting resin such as epoxy resin is used for the sheathing resin 51. In such a manner, it is possible to obtain a SAW device packaged by the sheathing resin 51, as shown in a cross sectional view of FIG. 14 which is taken along a line I—I shown in FIG. 13.

Figure 15:
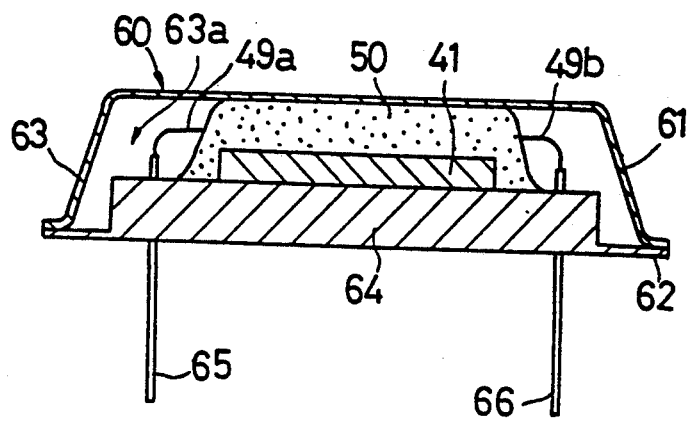
FIG. 15 is a cross sectional view showing a modified example of the second embodiment which is applied to a SAW device having a package structure using a metal case.

FIG. 15 is a cross sectional view showing a modified example of the second embodiment which is applied to a SAW device having a package structure using a metal case. In a SAW device 60, a package structure is formed using a metal case 61. The metal case 61 comprises a metal base 64 having a metal collar 62 in its periphery and a metallic cover member 63 having a housing space 63a opened downward. The metal collar 35 and the cover member 63 are joined to each other by welding in the periphery, thereby to seal the housing space 63a in the metal case 61. In the present embodiment, the SAW resonator element 1 shown in FIG. 2 adheres to the upper surface of the base 64 in the housing space 63a. Reference numerals 49a and 49b denote bonding wires, which respectively connect a SAW resonator element 1 to terminals 65 and 66. The terminals 65 and 66 are led out of the metal case 61 through the base 64 with they being insulated from the base 64.

Also in this modified example, a resin layer 50 is provided so as to cover the upper surface of the SAW resonator element 1. The resin layer 50 is made of the same material as that in the above described second embodiment. Consequently, the resin layer 50 is provided in such a range that it spreads slightly outward from the upper surface of the SAW resonator element 1 so as not to lead to a joint of the cover member 63 and the metal collar 62 because the fluidity thereof is low, as obvious from FIG. 15. Accordingly, the metal collar 62 and the cover material 63 are hardly insufficiently welded, thereby to make it possible to construct a reliable metal case 61.

Furthermore, even if the above described resin layer 50 is provided, the characteristics of the SAW resonator element 1 are not easily degraded. Accordingly, it is possible to obtain a SAW device having stable characteristics unless the distance between the SAW resonator element 1 and the cover member 63 is controlled with high precision.

The mixed ratio of the resin in the form of gel or having a Shore hardness of not more than 30 to the insulating powder in the second embodiment is so determined that desired fluidity can be obtained. However, the action of restraining the fluidity of resin is inversely proportional to the weight of insulating powder. Accordingly, in the case of heavy insulating powder, the mixed percentage by volume thereof may be small. On the other hand, in the case of light insulating powder, the final mixed percentage by volume thereof must be large. The relationship between the mixed percentage by volume of insulating powder and the weight thereof is the reverse of the relationship between the mixed percentage by weight of insulating powder and the weight thereof.

Figure 16:
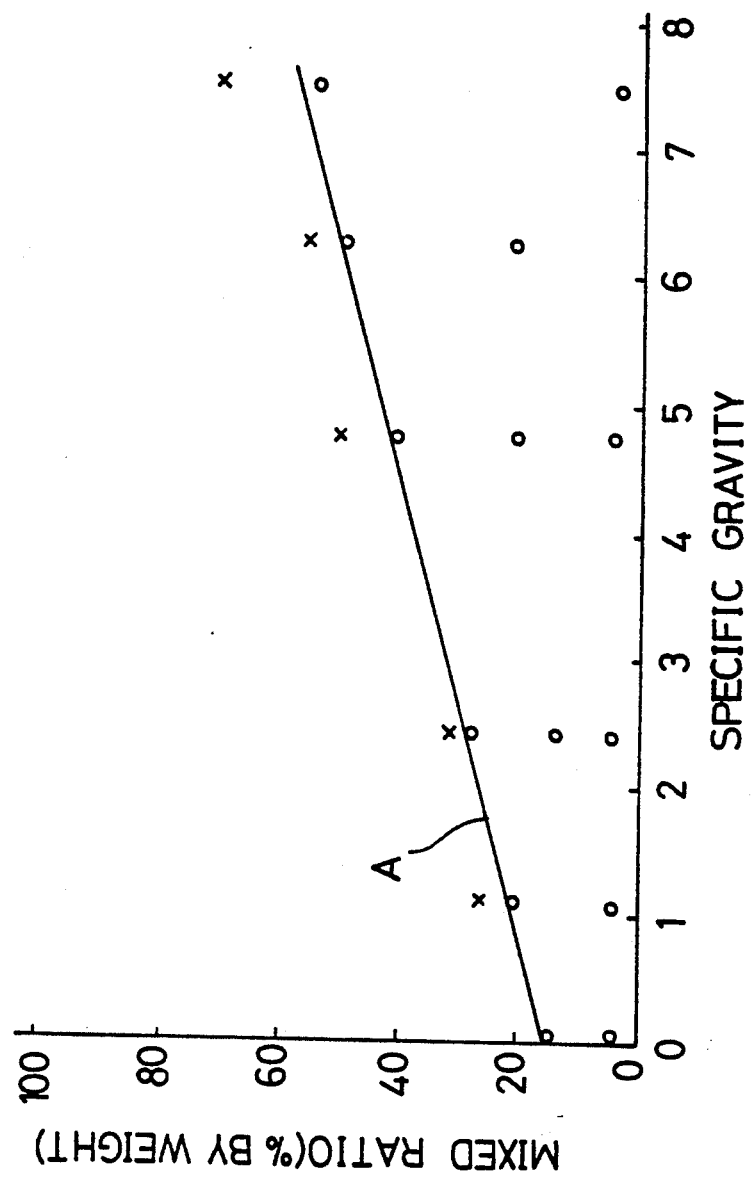
FIG. 16 is a diagram showing the resonance characteristics of the SAW device in a case where the mixed ratio and the specific gravity of insulating powder are changed.

FIG. 16 is a diagram for explaining a preferred range of the mixed ratio of the above descried insulating powder. In FIG. 16, the axis of ordinate indicates the mixed ratio (% by weight) of the insulating powder added to 100% by weight of the above resin in the form of gel or having a Shore hardness of not more than 30, and the axis of abscissa indicates the specific gravity of the insulating powder added. FIG. 16 shows the results of resonance characteristics displayed when resin layers obtained by mixing insulating powder having various specific gravities such as fine powdered silica (with a specific gravity of 2.3) with the resin in various ratios are formed on the SAW resonator element. In FIG. 16, "O mark" means that good resonance characteristics are displayed, and "X mark" means that resonance characteristics are degraded. More specifically, as can be seen from FIG. 16, when y and x are respectively taken as the mixed ratio (% by weight) of the insulating powder and the specific gravity thereof, the resonance characteristics are not degraded in a region below a straight line A expressed by the expression $y = 5.7x + 15$.

Consequently, it is preferable that the above described mixed ratio y satisfies the expression $y \leq 5.8x + 13.7$.

Meanwhile, the lower limit of the mixed ratio y of insulating powder is not particularly restricted, provided that the action of restraining the fluidity of the resin is obtained.

Description is now made of a SAW device according to a third embodiment of the present invention.

In the third embodiment, a disk-shaped piezoelectric mother substrate for obtaining a plurality of SAW devices is first prepared. A plurality of IDTs for constructing the plurality of SAW devices are then formed on the upper surface of the piezoelectric mother substrate. The IDTs are formed by evaporating an electrode material over the entire upper surface of the piezoelectric mother substrate and etching the same. The IDTs may be formed by another thin film forming technique such as printing or sputtering.

Figure 17:
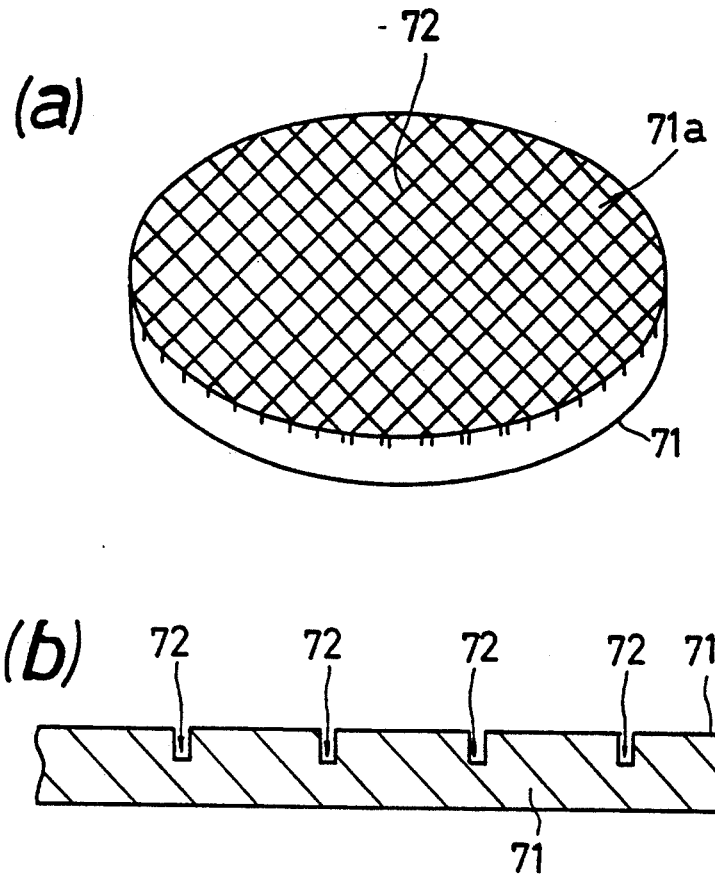
FIG. 17(a) is a perspective view showing a piezoelectric mother substrate used in a third embodiment of the present invention, and 17(b) is a partially broken and enlarged cross sectional view showing the piezoelectric mother substrate.

As shown in FIGS. 17(a) and (b), a plurality of grooves 72 reaching a position at a medium depth from an upper surface 71a of a piezoelectric mother substrate 71 are then formed using a dicing saw. It is pointed that a plurality of IDTs formed on the upper surface of the piezoelectric mother substrate 71 are omitted in FIGS. 17(a) and (b), for easy illustration.

As shown in an enlarged cross sectional view of FIG. 17(b), the groove 72 is so constructed that its bottom part has a certain degree of width. The groove 72 is inevitably formed because a cutting edge of the dicing saw has a certain degree of wall thickness.

The grooves 72 shown in FIG. 17(a) are provided so as to divide the piezoelectric mother substrate 71 for each SAW device in the subsequent process. Consequently, the above groove 72 is formed in the boundary between the SAW devices.

Figure 18:
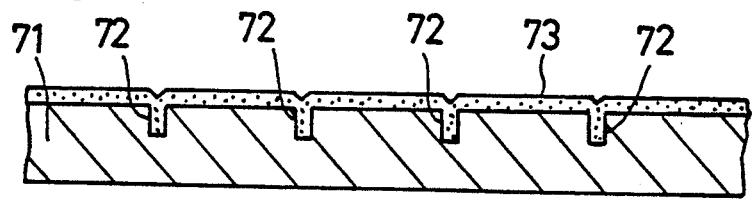
FIG. 18 is a partially broken and enlarged cross sectional view showing a piezoelectric mother substrate provided with a resin layer.
Figure 19:
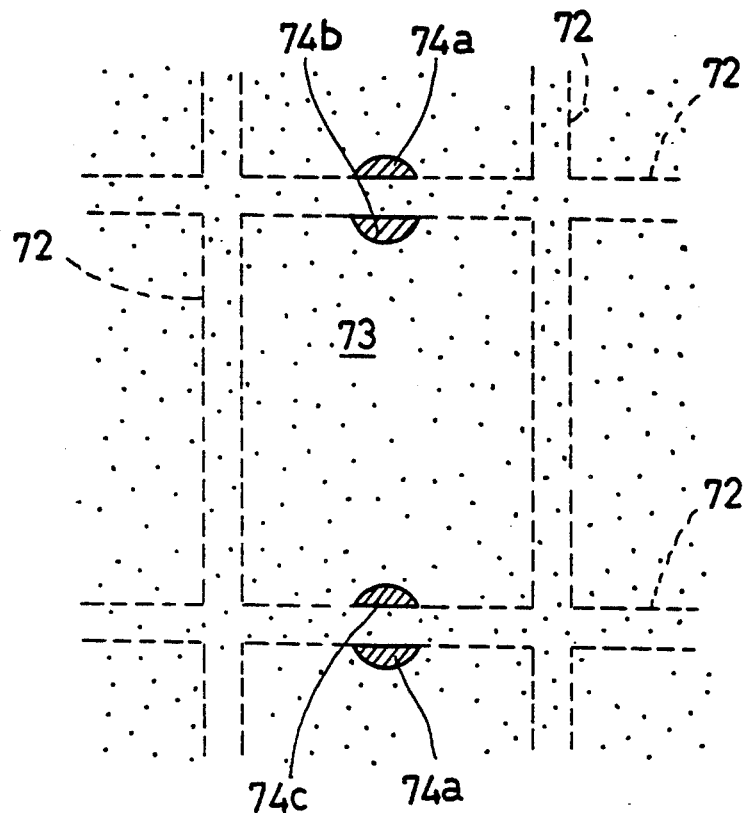
FIG. 19 is a partially enlarged plan view showing the upper surface of the piezoelectric mother substrate provided with a resin layer in an enlarged manner.

As shown in FIG. 18, resin 73 is applied to the upper surface of the piezoelectric mother substrate 71 and is cured after forming the grooves 72. The resin 73 is applied over the entire surface of an upper surface 71a of the piezoelectric mother substrate 71, except in parts 74a to 74d of electrodes of IDTs. Consequently, as shown in an enlarged cross sectional view of FIG. 18, the resin layer 73 is applied so as to lead to inner parts of the grooves 72 and is cured.

Used as the resin is resin in the form of gel whose rate of penetration measured by the penetrometer based on JIS K2220 is the range of 10 to 200 or resin whose Shore hardness or hardness measured by the hardness measuring method based on JIS K6301 is not more than 30. Specifically, examples of the resin are silicone resin and epoxy resin.

Meanwhile, in order not to apply the resin layer 73 to the parts 74a to 74d of the electrodes, the resin may be applied to the entire upper surface 71a of the piezoelectric substrate 71 with a mask being temporarily fixed to the parts 74a to 74d of the electrodes or may be printed using a screen for masking the parts 74a to 74d of the electrodes.

The piezoelectric mother substrate 71 provided with the resin layer 73 is divided along the grooves 72. This division is made by exerting external forces to portions where the grooves 72 are formed of the piezoelectric mother substrate 71 utilizing the fact that the portions where the grooves 72 are formed have a small wall thickness. As a result, a SAW device 75 in the embodiment shown in a cross sectional view of FIG. 20 is obtained.

Figure 20:
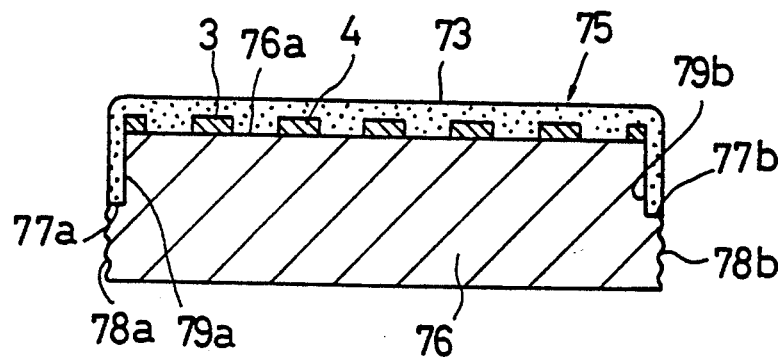
FIG. 20 is a cross sectional view showing a SAW device according to the third embodiment of the present invention.

Referring to FIG. 20, an IDT having comb electrodes 3 and 4 inserted to each other is formed on an upper surface 76a of a piezoelectric substrate 76, and a resin layer 73 is provided so as to cover the upper surface of the IDT. Consequently, when the SAW device 75 is packaged as a product, there is no need to specifically provide a cavity above the IDT. For example, the SAW device 75 may be merely dipped into sheathing resin. Accordingly, it is possible to simplify the package structure.

Furthermore, steps 77a and 77b extending outward are provided in a position at an almost medium height of end surfaces of the piezoelectric substrate 76 which are positioned in the direction of the SAW propagation. The steps 77a and 77b are formed by the bottom parts of the above described grooves 72. More specifically, in each of the SAW devices 75 obtained by dividing the piezoelectric mother substrate 71 along the grooves 72, the steps 77a and 77 are formed, and end surface portions 78a and 78b below the steps 77a and 77b are formed as rough surfaces. On the other hand, end surface portions 79a and 79b above the steps 77a and 77b are so formed as to have smoother surfaces than the end surface portions 78a and 78b because they appear when the grooves 72 are formed using the dicing saw.

In the SAW device 75 according to the present invention, the steps 77a and 77b are provided on the end surfaces which are positioned in the direction of the SAW propagation, and the end surface portions 78a and 78b below the steps 77a and 77b are formed as rough surfaces. Accordingly, a bulk wave can be dispersed in the end surface portions 78a and 78b below the steps 77a and 77b. Moreover, the resin layer 73 is provided so as to cover the end surface portions 79a and 79b above the steps 77a and 77b. Accordingly, the bulk wave can be absorbed in the end surface portions 79a and 79b above the steps 77a and 77b. Consequently, it is possible to effectively reduce a spurious mode due to the bulk wave.

Description is now made of the specific experimental results. As the SAW resonator element 1 shown in FIG. 2, a SAW resonator element 1 in which a plurality of electrode fingers are formed with each of them having a width of 20 μm and a pitch therebetween being 80 μm on the upper surface of a rectangular piezoelectric substrate measuring 1.0×1.6×1.2 mm which is made of PZT is first prepared. Impedance-frequency characteristics of the conventional SAW resonator element 1 are indicated by a solid line A in FIG. 21.

Figure 21:
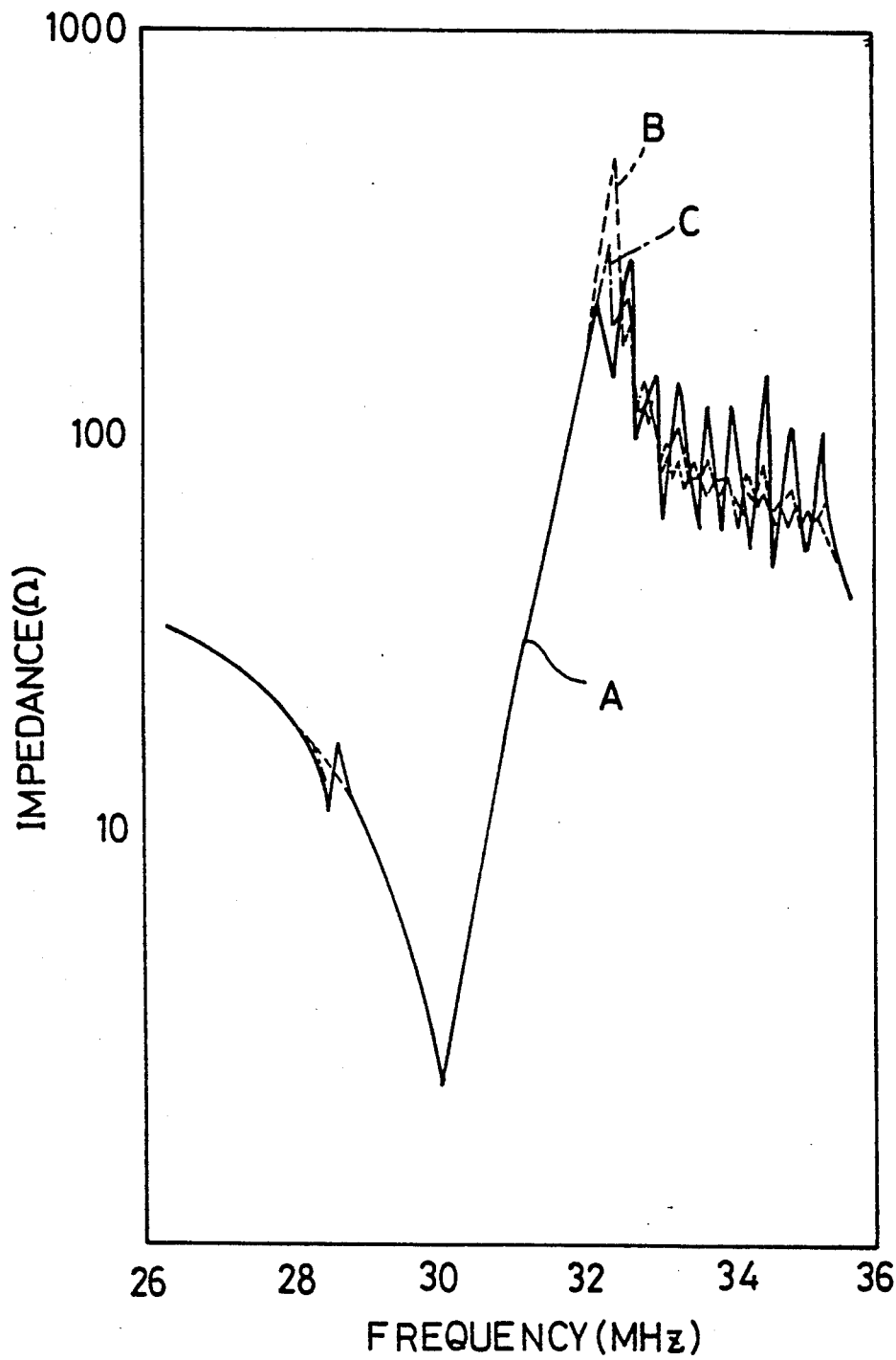
FIG. 21 is a diagram showing impedance-frequency characteristics of the SAW devices in the third embodiment, the conventional example and a comparative example.

A SAW resonator similarly formed in accordance with the above described third embodiment is then fabricated and impedance-frequency characteristics thereof are measured, to obtain the results indicated by a broken line B in FIG. 21.

For comparison, impedance-frequency characteristics of a SAW resonator constructed in exactly the same manner as the third embodiment except that no resin layer 73 is provided, to obtain the results indicated by a one-dot and dash line C in FIG. 21.

As can be seen from the impedance-frequency characteristics indicated by the solid line A, the broken line B, and the one-dot and dash line C in FIG. 21, a spurious mode can be effectively reduced in the present embodiment.

Furthermore, as can be seen from FIG. 21, even if the resin layer 73 is provided on the piezoelectric substrate, the crest-to-trough ratio, that is, the ratio of impedance at a resonant frequency to impedance at an antiresonant frequency is not decreased.

Although in the above described third embodiment, the IDTs are formed on the piezoelectric mother substrate and then, the grooves 72 are formed, the IDTs may be formed on the piezoelectric mother substrate after the grooves 72 are formed. In addition, although in the above described third embodiment, the end surface portions 78a and 78b below the steps 77a and 77b are projected outward, the end surface portions 79a and 79b above the steps 77a and 77b may be projected outward.

The present invention is applicable to not only a SAW resonator of an end surface reflection type as shown in FIG. 2 but also a SAW device having another structure such as a SAW device comprising a reflector.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface wave device using an SH-type surface wave whose main displacement is in the direction perpendicular to the direction of the surface wave propagation out of surface waves which are propagated on a piezoelectric substrate, comprising:
   a piezoelectric substrate;
   at least one interdigital transducer formed on said piezoelectric substrate; and
   a resin layer in the form of gel which is provided so as to cover at least said interdigital transducer.

2. The surface wave device according to claim 1, wherein insulating powder is added to said resin layer and is dispersed therein.

3. The surface wave device according to claim 1, wherein said surface wave device is a surface wave resonator of an end surface reflection type.

4. The surface wave device according to claim 1, wherein said SH-type surface wave is a BGS wave.

5. The surface wave device according to claim 1, wherein
   steps projected outward are formed in a position at an almost medium height of end surfaces, which exist in the direction of the surface wave propagation, of said piezoelectric substrate, and end surface portions below the steps are formed as rougher surfaces than end surface portions above the steps, and
   said resin layer is formed so as to cover the upper surface of said piezoelectric substrate and the end surface portions above said steps.

6. The surface wave device according to claim 5, wherein said surface wave device is a surface wave resonator of an end surface reflection type.

7. The surface wave device according to claim 5, wherein said SH-type surface wave is a BGS wave.

8. A surface wave device using an SH-type surface wave whose main displacement is in the direction perpendicular to the direction of the surface wave propagation out of surface waves which are propagated on a piezoelectric substrate, comprising:
   a piezoelectric substrate;
   at least one interdigital transducer formed on said piezoelectric substrate; and
   a resin layer having a Shore hardness of not more than 30 which is provided so as to cover at least said interdigital transducer.

9. The surface wave device according to claim 8, wherein insulating powder is added to said resin layer and is dispersed therein.

10. The surface wave device according to claim 8, wherein said surface wave device is a surface wave resonator of an end surface reflection type.

11. The surface wave device according to claim 8, wherein said SH-type surface wave is a BGS wave.

12. The surface wave device according to claim 8, wherein
   steps projected outward are formed in a position at an almost medium height of end surfaces, which exist in the direction of the surface wave propagation, of said piezoelectric substrate, and end surface portions below the steps are formed as rougher surfaces than end surface portions above the steps, and
   said resin layer is formed so as to cover the upper surface of said piezoelectric substrate and the end surface portions above said steps.

13. The surface wave device according to claim 12, wherein said surface wave device is a surface wave resonator of an end surface reflection type.

14. The surface wave device according to claim 12, wherein said SH-type surface wave is a BGS wave.

* * * * *